(12) United States Patent
Schafferer

(10) Patent No.: US 6,774,683 B2
(45) Date of Patent: Aug. 10, 2004

(54) CONTROL LOOP FOR MINIMAL TAILNODE EXCURSION OF DIFFERENTIAL SWITCHES

(75) Inventor: Bernd Schafferer, Gloucester, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/217,842

(22) Filed: Aug. 13, 2002

(65) Prior Publication Data

US 2004/0032356 A1 Feb. 19, 2004

(51) Int. Cl.[7] .................................................. H03K 4/94
(52) U.S. Cl. ........................................ 327/130; 341/114
(58) Field of Search ................................ 341/114, 100, 341/101; 327/112, 130, 116, 170, 258, 536, 537, 539; 326/93, 97

(56) References Cited

U.S. PATENT DOCUMENTS

| | | | | |
|---|---|---|---|---|
| 4,801,819 A | * | 1/1989 | Theus et al. ................ | 326/28 |
| 4,827,157 A | * | 5/1989 | Machida et al. ............ | 327/259 |
| 5,041,738 A | * | 8/1991 | Walters, Jr. ................. | 327/130 |
| 5,541,551 A | * | 7/1996 | Brehner et al. ............. | 327/539 |
| 5,805,089 A | * | 9/1998 | Fiedler et al. .............. | 341/101 |
| 5,831,451 A | * | 11/1998 | Bosshart ...................... | 326/93 |
| 6,046,607 A | * | 4/2000 | Kohdaka ...................... | 326/97 |
| 6,456,154 B2 | * | 9/2002 | Sugimura .................... | 327/537 |
| 6,545,518 B2 | * | 4/2003 | Saeki ........................... | 327/116 |

* cited by examiner

Primary Examiner—Michael J. Tokar
Assistant Examiner—Linh V Nguyen
(74) Attorney, Agent, or Firm—Gauthier & Connors LLP

(57) ABSTRACT

A system and method are provided for controlling the on/off timing relationship between two transistors in a differential that are connected at a tail node to a common current generator. The on/off timing relationship is controlled by on/off signals that control the state of the transistors such that one transistor turns one while the other is turning off. An overlap signal is derived from the tail node excursion and is indicative of whether the on/off signals are overlapping too much or too little. A control signal is generated based on the overlap signal. The timing of driver signals used to derive the on/off signals is adjusted based on the control signal. When more overlap is needed, the timing of the driver signals is adjusted such that there is more overlap of the derived on/off signals. When less overlap is needed, the timing of the driver signals is adjusted such that there is less overlap of the derived on/off signals. An embodiment that adjusts the voltage of the on/off signals to control the on/off timing is also disclosed.

29 Claims, 5 Drawing Sheets

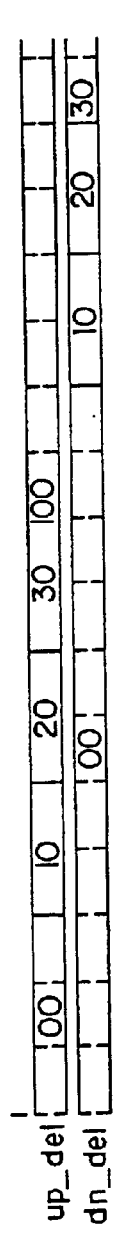
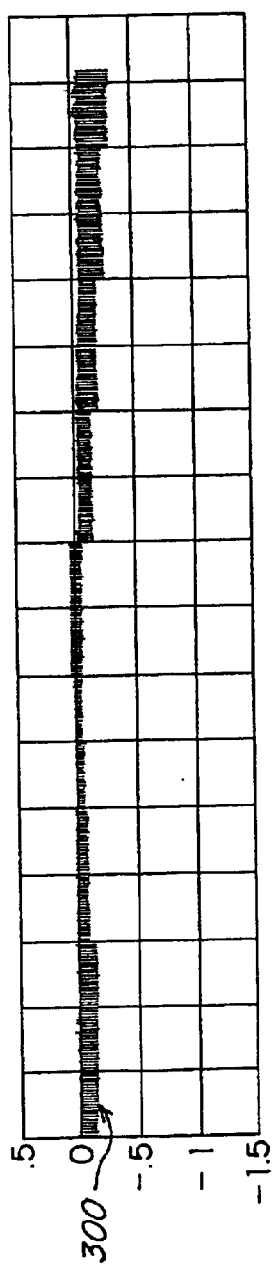
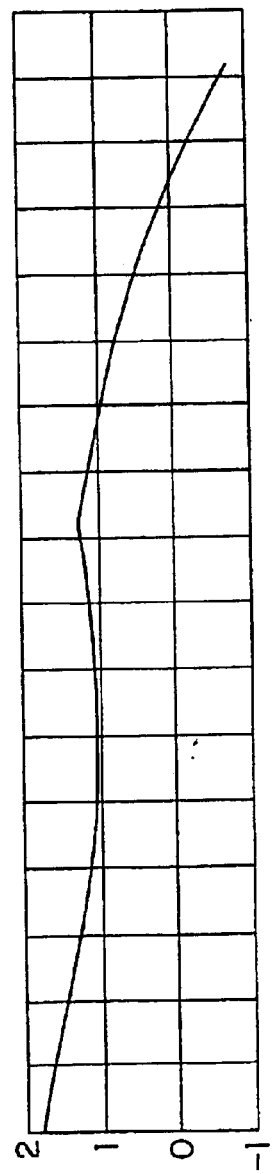
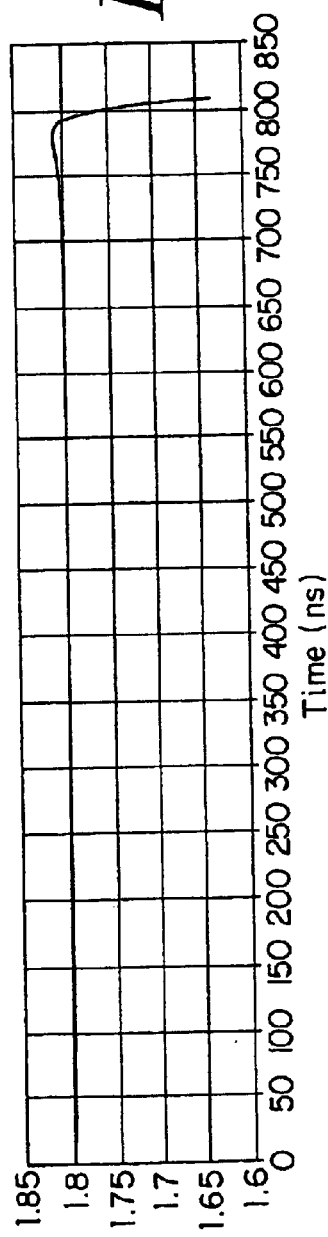
FIG. 3a
FIG. 3b
FIG. 3c
FIG. 3d

CONTROL LOOP FOR MINIMAL TAILNODE EXCURSION OF DIFFERENTIAL SWITCHES

BACKGROUND OF THE INVENTION

The invention relates to the field of control loops, and in particular to a control loop to control the on/off timing of differential switches.

Differential switches in which one transistor is turned off while the other is turned on so as to steer a common current along a particular path are used in a number of devices. One such device is a differential current steering digital-to-analog converter (DAC). Generally, a differential current steering DAC is a device that converts a digital value into a differential current by steering an amount of current out one or the other output of a differential output pair depending on the value of each bit in the digital word. When using such differential switches in a differential current steering DAC or other device, it is important to control the on/off timing relationship between the two transistors.

SUMMARY OF THE INVENTION

In one aspect, the present invention provides a control loop for controlling the on/off timing relationship between two transistors in a differential switch that are connected at a tail node to a common current generator. The on/off timing relationship is controlled by on/off signals that control the state of the transistors such that one transistor turns on while the other is turning off. The control loop comprises a controller and a clock generator. The controller receives an overlap signal indicative of whether the on/off signals are overlapping too much or too little. The overlap signal is derived from the tail node excursion. The clock generator receives a control signal from the controller. The control signal is based on the overlap signal and causes the clock generator to adjust the timing of driver signals used to derive the on/off signals. When more overlap of the on/off signals is needed, the control signal causes the clock generator to adjust the timing of the driver signals such that there is more overlap of the derived on/off signals. When less overlap of the on/off signals is needed, the control signal causes the clock generator to adjust the timing of the driver signals such that there is less overlap of the derived on/off signals.

Another aspect of the present invention provides a method of controlling the on/off timing relationship between two transistors in a differential switch that are connected at a tail node to a common current generator. The on/off timing relationship is controlled by on/off signals that control the state of the transistors such that one transistor turns on while the other is turning off. An overlap signal is derived from the tail node excursion. The overlap signal is indicative of whether on/off signals are overlapping too much or too little. A control signal is generated based on the overlap signal. The timing of driver signals used to derive the on/off signals is adjusted based on the control signal. When more overlap of the on/off signals is needed, the timing of the driver signals is adjusted such that there is more overlap of the derived on/off signals. When less overlap of the on/off signals is needed, the timing of the driver signals is adjusted such that there is less overlap of the derived on/off signals.

An alternative way to control the on/off timing relationship between transistors 202 is to adjust the voltage levels of the on/off signals. In this embodiment, the present invention provides a control loop to control the on/off timing relationship between two transistors in a differential switch that are connected at a tail node to a common current generator. The on/off timing relationship of the transistors is controlled by on/off signals that control the state of the transistors such that one transistor turns on while the other is turning off. The control loop comprises a controller and at least one switch driver. The controller receives an overlap signal indicative of whether the on/off timing of the transistors is overlapping too much or too little. The overlap signal is derived from the tail node excursion. The switch driver receives a control signal from the controller, wherein the control signal is based on the overlap signal and causes the switch driver to adjust the voltage of the on/off signals. When more on/off overlap is needed, the control signal causes the switch driver to adjust the voltage of the on/off signals such that there is more overlap of the transistors' on/off timing. When less on/off overlap is needed, the control signal causes the switch driver to adjust the voltage of the on/off signals such that there is less overlap of the transistors' on/off timing.

In another aspect of this embodiment, the present invention provides a method of controlling the on/off timing relationship between two transistors in a differential switch that are connected at a tail node to a common current generator. The on/off timing relationship is controlled by on/off signals that control the state of the transistors such that one transistor turns on while the other is turning off. An overlap signal is derived from the tail node excursion. The overlap signal is indicative of whether on/off timing is overlapping too much or too little. A control signal is generated based on the overlap signal. The voltage of the on/ff signals is adjusted based on the control signal. When more overlap of the on/off timing is needed, the voltage of the on/off signals is adjusted such that there is more overlap of the transistors' on/off timing. When less overlap of the on/off timing is needed, the voltage of the on/off signals is adjusted such that there is less overlap of the transistors' on/off timing.

BRIEF DESCRIPTION OF THE DRAWINGS

FIGS. 3a–3e, collectively, illustrate simulations of various nodes for the embodiment of FIG. 2a when different values of up_del and dn_del are applied.

DETAILED DESCRIPTION OF THE INVENTION

Figure 1:
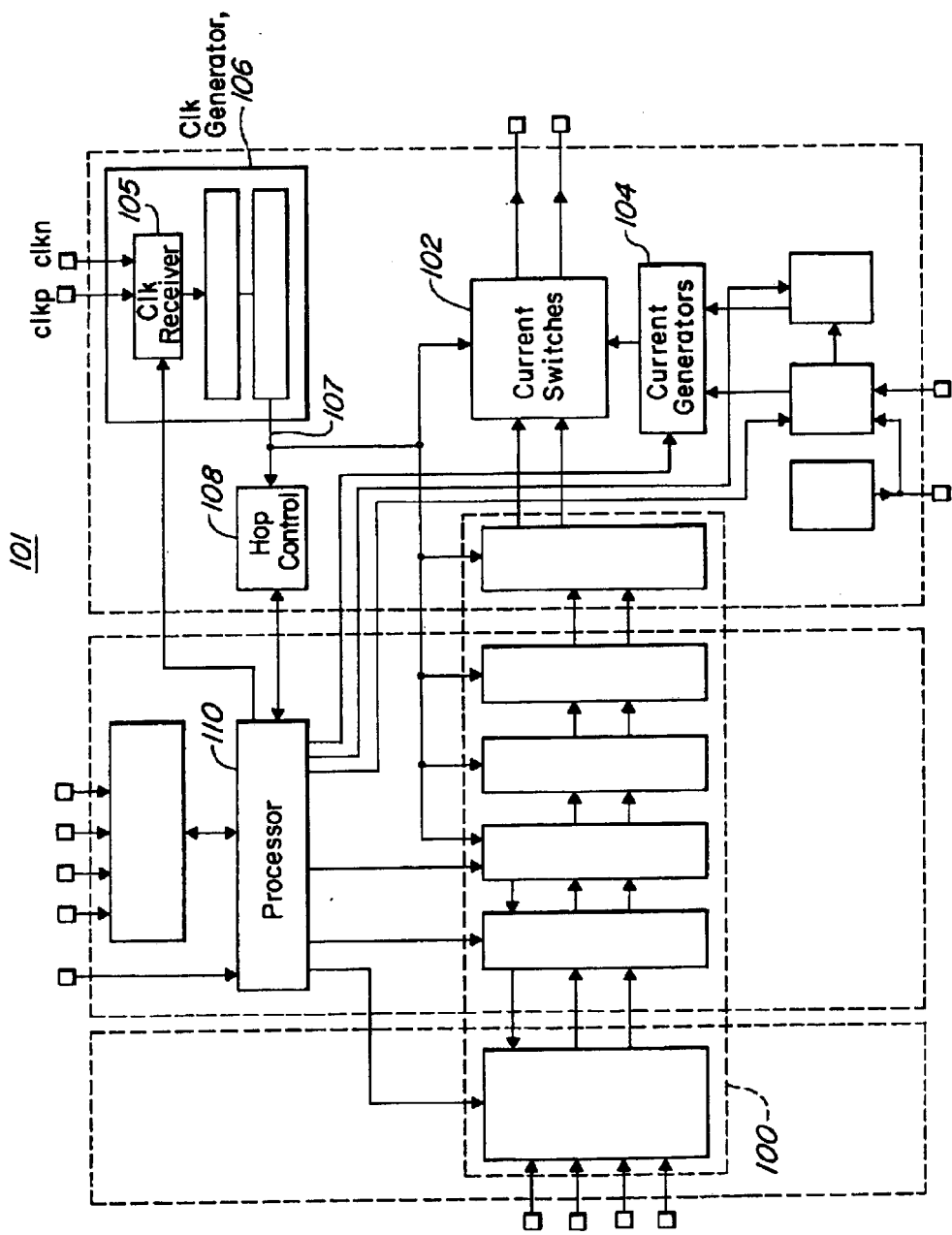
FIG. 1 illustrates a block diagram of the control loop according to the present invention as used in a differential current steering DAC.

There is depicted in the drawings, and will herein be described in detail, a differential switch control loop according to the present invention as used with a current steering DAC. The present disclosure, however, is to be considered as an exemplification of the principles of the invention and the associated functional specifications for its construction, and is not intended to limit the invention to the embodiment (s) illustrated. Those skilled in the art will envision many other possible variations within the scope of the present invention.

FIG. 1 illustrates a block diagram of the control loop according to the present invention as used in a differential current steering DAC 101. DAC 101 comprises a matrix of differential current switches 102 that steer current from current generators 104 to output IP or output IN (which form a differential output pair) based on the digital value from pre-processing circuitry 100. Pre-processing circuitry processes digital data into a digital value that is applied to the cells of current switches 102. Each bit of the digital value is latched into the correct cell decoder, and the corresponding transistors are switched as appropriate, based on the timing of a differential clock. While the particular implementation shown uses a differential clock, any type of clock signal can be used.

Generally, a clock generator 106 receives the differential clock as signal clkp and clkn. Clock generator 106 uses the differential clock to generate the driver signals 107 from which the transistor on/off signals in a cell are derived. Clock generator 106 derives the driver signals from output signals output by a clock receiver 105 in clock generator 106. Clock receiver 105 receives the differential clock signal and generates the output signals from the clock signal. Clock receiver 105 is preferably implemented according to the teachings of the copending application entitled "Differential Clock Receiver with Adjustable Output Crossing Point", U.S. Patent Application No. 10/217,681 filed by common assignee on even date herewith, and incorporated herein by reference.

Driver signals 107 are received by both the current switches 102 (so that the transistor on/off signals can be derived) and by a hop control circuit 108. Hop control circuit 108 determines whether the on/off timing of the transistors is overlapping too much or not enough. The present invention uses the excursion of the tail node (i.e., the common current source node for the transistors of the differential switch) as an indicator of whether the on/off timing is overlapping too much or too little. An overlap signal that is indicative of whether the on/off timing is overlapping too much or too little is derived from the tail node excursion. This signal is sent to processor 110. If the on/off timing is overlapping too much, processor 110 sends a signal to clock generator 106 that causes it to generate driver signals that result in on/off timing with less overlap. If the on/off timing is not overlapping enough, processor 110 sends a signal to clock generator 106 that causes it to generate driver signals that result in on/off timing with more overlap. This continues until an optimal point is reached.

Figure 2A:
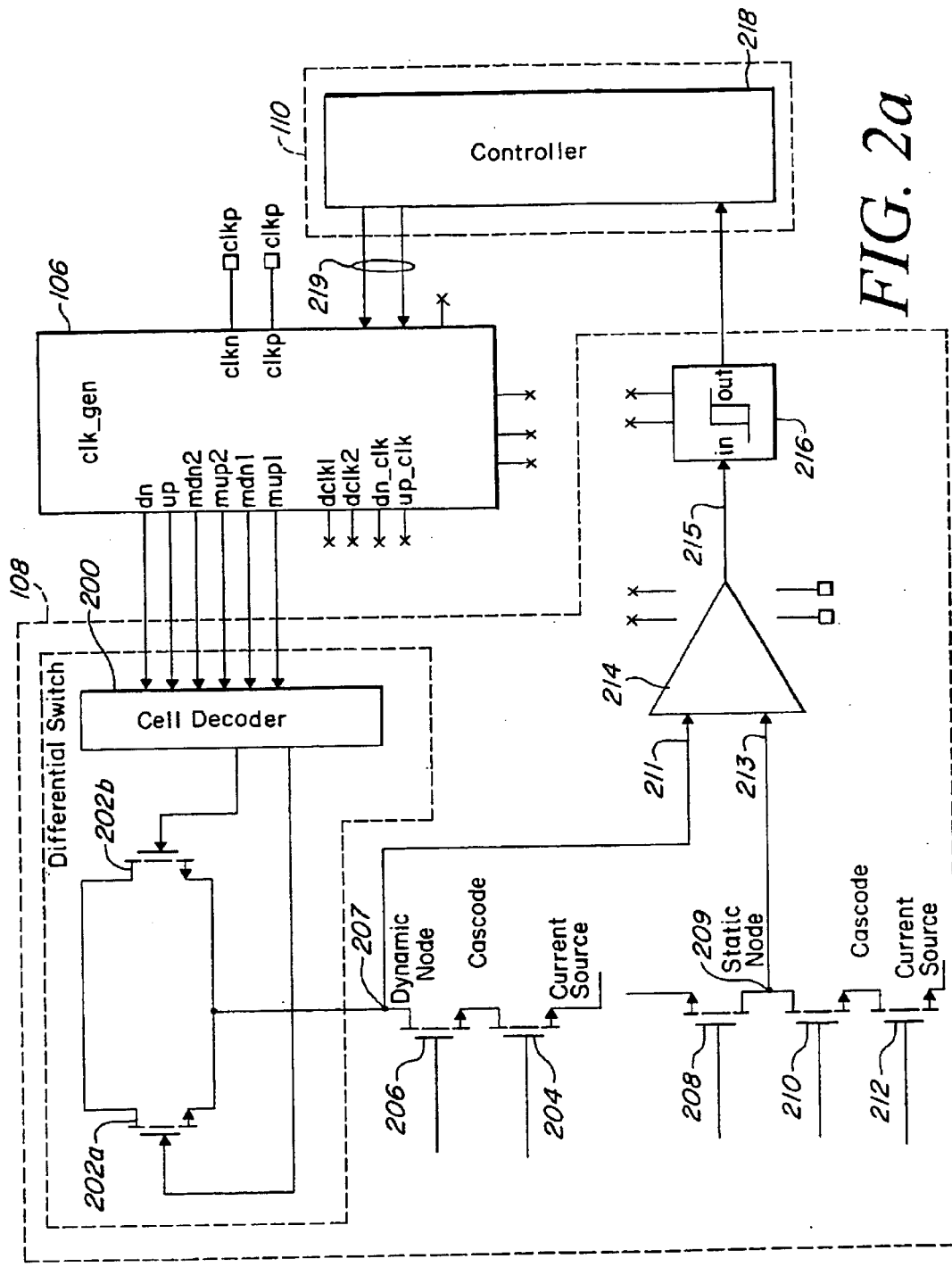
FIG. 2a illustrates one embodiment of the present invention that determines the overlap quality by comparing the tail node to a DC reference.

FIG. 2a illustrates one embodiment of the present invention that determines the overlap quality by comparing the tail node to a DC reference. As shown, hop control circuit 108 comprises transistors 202 that form a differential current switch. The differential current switch is a replica of the current switches in the matrix of current switches 102. On/off signals are provided to the gates of transistors 202 by cell decoder 200. The on/off signals control the state of transistors 202 such that one transistor turns on while the other is turning off. The on/off signals are derived from the driver signals, dn and up, supplied by clock generator 106. Transistors 202 are connected at a tail node 207 to a cascoded current generator comprising a current source transistor 204 and cascode transistor 206. While a cascoded current generator has been shown, one of skill in the art would appreciate the present invention is not limited thereto. Also, while the cascoded current generator is shown located in hop control 108, it could be implemented elsewhere, such as with other current generators 104.

A DC reference is set up using transistor 208 and another cascoded current generator comprising transistors 210 and 212. The DC reference is taken at the node 209 and is equivalent to the value that node 207 would be when there is an appropriate amount of overlap between the on/off signals, i.e. when the overlap of the on/off signals is neither too big or too little.

Tail node 207 is compared to DC reference node 209 by comparator 214. A first input 211 of comparator 214 is connected to tail node 207, while a second input 213 of comparator 214 is connected to DC reference node 209. An output 215 of comparator 214 provides an overlap signal indicative of whether the average of tail node 207 is greater than or less than DC reference node 209. When the on/off signals are overlapping too much, the average of tail node 207 is greater than DC reference node 209. Conversely, when the on/off signals are not overlapping enough, the average of tail node 207 is less than DC reference node 209. The output of comparator 214 is provided to a controller 218 in processor 110. While not necessary, hysteresis 216 is preferably used to provide a "clean" digital signal to controller 118.

Based on output 215, controller 218 determines whether the on/off signals should be overlapped more or less. Controller 218 sends a control signal to clock generator 106 that causes clock generator 106 to adjust the timing of the driver signals, dn and up, that are used by cell decoder 200 to derive the on/off signals. When more overlap is needed, the control signal causes clock generator 106 to adjust the timing such that there is more overlap. Conversely, when less overlap is needed, the control signal causes clock generator 106 to adjust the timing such that there is less overlap. After a preset settling period following the clock generator's adjustment of the timing, controller 218 again determines from output 215 whether the on/off signals should be overlapped more or less, and adjusts the control signal again as appropriate. This cycle is continued until an optimal point is reached.

In the embodiment shown, the control signal comprises two digital words, dn_del and up_del. Decreasing the value of dn_del causes clock generator 106 to decrease the overlap of the driver signals, dn and up, while increasing the value of dn_del increases the overlap of the driver signals. Conversely, decreasing the value of up_delay causes clock generator 106 to increase the overlap of the driver signals, while increasing the value of up_del decreases the overlap of the driver signals. Thus, for example, when the average of tail node 207 is higher than DC reference node 209, the value of dn_del is decreased by one. If the optimal point is not reached, controller 218 continues to decrease dn_del each cycle until dn_del is zero. Controller 218 then increases up_del by one each cycle. While controller 218 has been described as using a particular control algorithm to adjust the timing to an optimal point, it should be noted that other control algorithms can be used. For instance, an alternative control algorithm that can be implemented by controller 218 is a successive approximation algorithm.

Figure 2B:
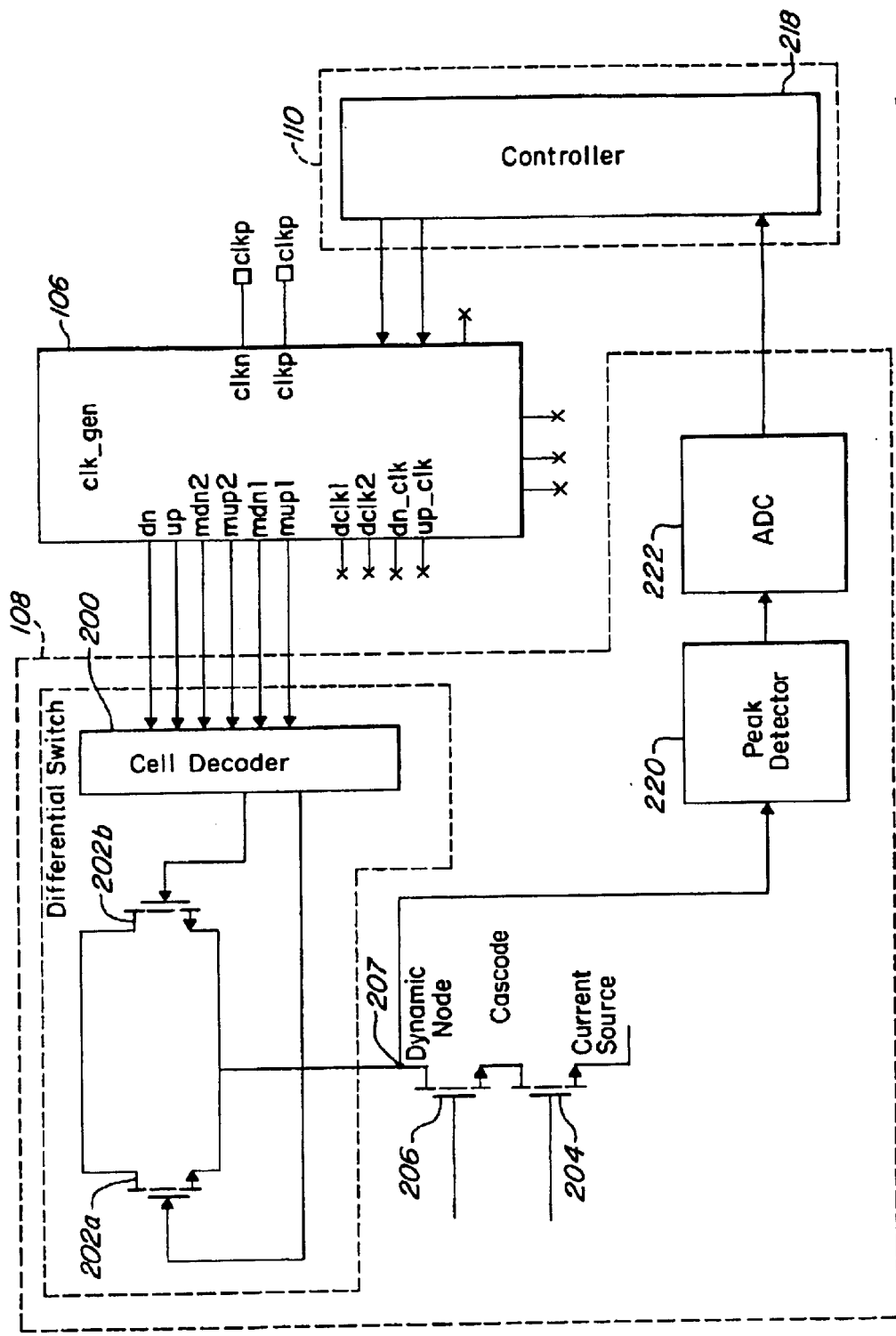
FIG. 2b illustrates one embodiment of the present invention that determines the overlap quality from the peak-to-peak excursion of the tail node.

FIG. 2b illustrates one embodiment of the present invention that determines the overlap quality from the peak-to-peak excursion of the tail node. When the overlap of the on/off timing is at the correct amount, the excursion of the tail node will be at a minimum. As shown, this embodiment is similar to the embodiment of FIG. 2a, except that a DC reference is not established and the comparator is replaced by a peak detector 220 followed by an analog-to-digital converter (ADC) 222. Peak detector detects the peak-to-peak swing of tail node 220 in each cycle and outputs an overlap signal indicative of the peak-to-peak value. The overlap signal is converted to a digital value by ADC 222 and provided to controller 218. Based on the current peak value and previous peak value(s), controller 218 attempts to minimize the peak-to-peak excursion of tail node 207 by sending a control signal to clock generator 106 that causes clock generator 106 to adjust the timing of the driver signals, dn and up. Controller 218 continues to cause the timing to be adjusted each cycle until the excursion of tail node 207 is at a minimum. As with the embodiment of FIG. 2a, clock generator 106 is preferably implemented according to the teachings of the copending application entitled "Differential Clock Receiver with Adjustable Output Crossing Point", filed by common assignee on evendate herewith. Thus, the control signal preferably comprises the two digital words, dn_del and up_del.

Figure 3E:
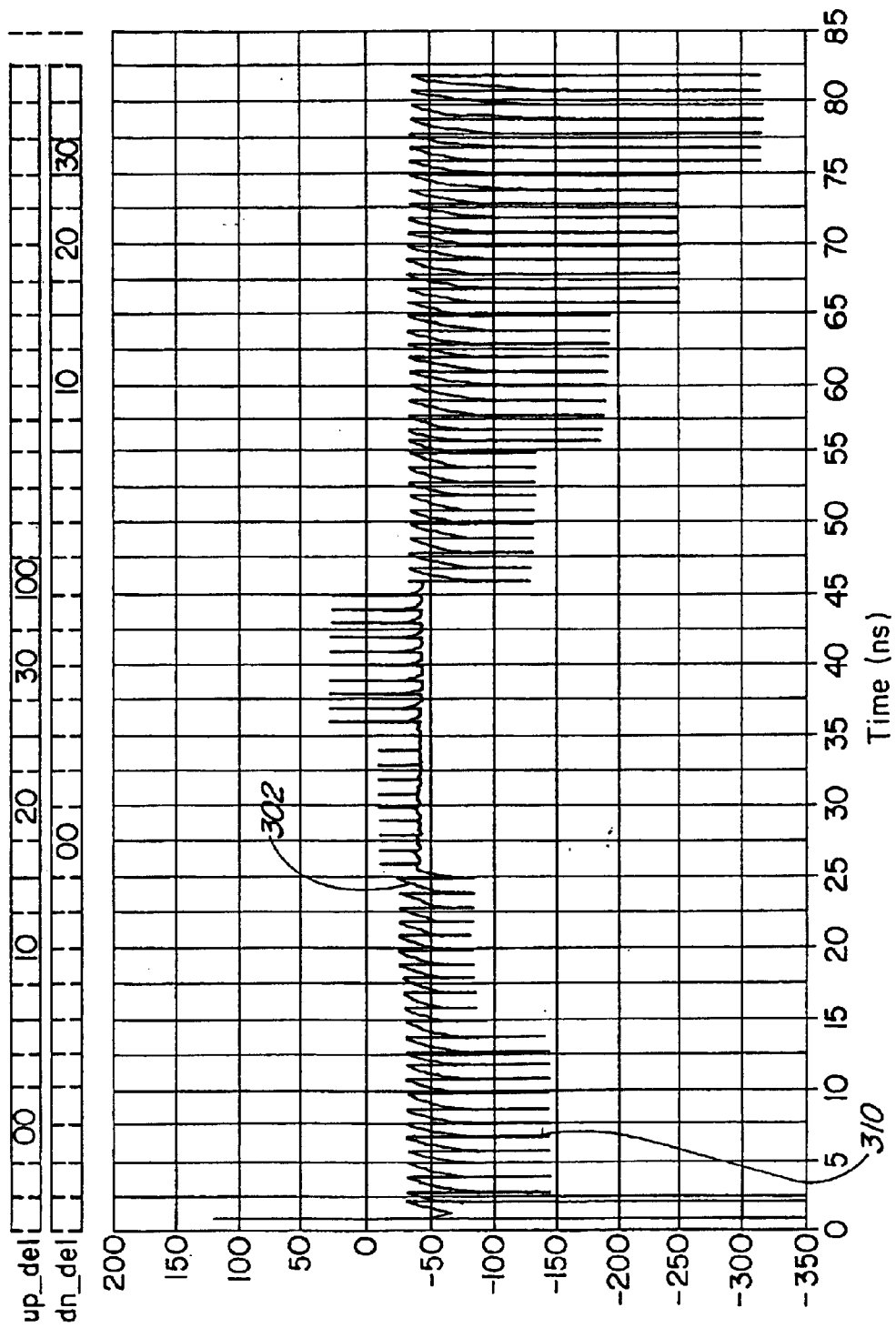

FIGS. 3a–3e illustrate simulations of various nodes for the embodiment of FIG. 2a when different values of up_del and dn_del are applied. FIG. 3a illustrates the values of up_del and dn_del. As shown, from 0 to 450 ns, up_del is being increased, while dn_del is zero. From 450 to about 800 ns, dn_del is being increased, while up_del is zero. FIG. 3a shows the corresponding response 300 of tail node 207 along with DC reference node 209. The response 300 of tail node 207 appears as solid black areas and the DC reference can not be seen because of the y-axis is too small in FIG. 3a. FIG. 3e, however, illustrates the response 300 of tail node 207 and response 302 of DC reference node on a time scale that shows the spikes of tail node and DC reference. As shown, DC reference node 209 has a generally static response 302 of about −50 millivolts. When the average of the spikes 302 of tail node is below DC reference 302, comparator 214 has a downward sloping output (illustrated in FIG. 3c). This occurs until up_del has a value of 20. Then, the average is above DC reference 302 and comparator 214 has an upward sloping output. Once up_del has a value of zero again, the average is below DC reference 302 comparator 214 has an output with a downward slope. As dn_del continues to be increased, the peak of the spikes below DC reference 302 continues to increase, causing the average to be further below DC reference 302. This causes the downward slope of the comparator output to increase.

An alternative way to control the on/off timing relationship between transistors 202 is to adjust the voltage levels of the on/off signals. In this case, the timing of the on/off signals doesn't change, only the voltage levels, and the current transfer function $I_d=f(V_{gate})$ is used to modulate the on/off timing relation. In this case, controller 218 would receive the overlap signal derived from the tail node excursion and derive a control signal based on the overlap signal. Controller 218 would send the control signal to a switch driver(s) (not shown), which is located within the cell decoder or between cell decoder 200 and transistors 202 (the switch drivers have not been illustrated for simplicity). The control signal would cause the switch driver to adjust the voltage of the on/off signals, such there is more or less overlap of the transistors' on/off timing, as needed. For instance, for the embodiment of FIG. 2a, if the average of tail node 207 is greater than the DC reference node 209, then the of/off signals' voltage swing is increased. Conversely, if the average of the tail node 207 is less than the DC reference 209, then the on/off signals' voltage swing is decreased.

Although the present invention has been shown and described with respect to several embodiments thereof, various changes, omissions and additions to the form and detail thereof, may be made therein, without departing from the spirit and scope of the invention.

What is claimed is:

1. A control loop to control the ON/OFF timing relationship between one or more differential switches having two transistors, the one or more differential switches being connected at a tail node to a common current generator, the ON/OFF timing relationship of the transistors controlled by ON/OFF signals that control the state of the transistors such that one transistor turns ON while the other is turning OFF, the control loop comprising:
   a controller to receive an overlap signal, the overlap signal being derived from the tail node and indicative of whether the ON/OFF signals are overlapping too much or too little, and to generate a control signal based upon the received overlap signal; and;
   a clock generator, in response to said control signal from said controller, adjusting the timing of driver signals used to derive the ON/OFF signals such that when said control signal indicates, more overlap of the ON/OFF signals is needed said clock adjusts the timing of the driver signals to cause more overlap of the derived ON/OFF signals; and when said control signal indicates less overlap of the ON/OFF signals is needed, said clock generator adjusts the timing of the driver signals such that there is less overlap of the derived ON/OFF signals.

2. The control loop, as per claim 1, wherein the overlap signal is derived based on a comparison of the tail node to a DC reference node.

3. The control loop, as per claim 2, wherein the comparison is performed using a comparator having a first input connected to the tail node and a second input connected to the DC reference node, wherein an output of the comparator outputs the overlap signal.

4. The control loop, as per claim 3, wherein hysterisis is used with the comparator.

5. The control loop, as per claim 1, wherein the overlap signal is derived based on the peak-to-peak value of the tail node.

6. The control loop, as per claim 5, wherein the peak-to-peak value is measured by a peak detector.

7. The control loop, as per claim 6, wherein the peak-to-peak value measured by the peak detector is converted to a digital value by an analog-to-digital converter and provided to the controller as the overlap signal.

8. The control loop, as per claim 1, wherein the control loop is used in a differential current steering digital-to-analog converter.

9. A system comprising:
   a differential switch comprising two transistors and being connected at a tail node to a common current generator, the ON/OFF timing relationship of the transistors controlled by ON/OFF signals that control the state of the transistors such that one transistor turns ON while the other is turning OFF;
   a comparator having a first input connected to the tail node and a second input connected to a DC reference node, said DC reference node being equivalent to a value that the tail node would be when there is an appropriate amount of overlap between the ON/OFF signals;
   said comparator outputting an overlap signal indicative of whether an average of the tail node is greater than or less than the DC reference node;
   a controller, in response to said overlap signal, generating a control signal; and
   a clock generator, in response to said control signal, to generate driver signals from which the ON/OFF signals are derived, a timing of the driver signals being adjusted based upon said control signal.

10. The system, as per claim 9, wherein hysterisis is used with the comparator.

11. The system, as per claim 9, wherein the system is used in a differential current steering digital-to-analog converter.

12. A system comprising:
a differential switch comprising two transistors and being connected at a tail node to a common current generator, the ON/OFF timing relationship of the transistors controlled by ON/OFF signals that control the state of the transistors such that one transistor turns ON while the other is turning OFF;
a peak detector having an input operatively connected to the tail node and generating an overlap signal indicative of a peak-to-peak value of the tail node;
an analog-to-digital converter, operatively connected to said peak detector and responsive to said overlap signal, to convert said overlap signal to a digital value;
a controller, operatively connected to said analog-to-digital converter, to generate a control signal based upon said overlap signal; and
a clock generator, in response to said control signal, to generate driver signals from which the ON/OFF signals are derived, said driver signals being adjusted based upon said control signal.

13. The system, as per claim 12, wherein the system used in a differential current steering digital-to-analog converter.

14. A method of controlling the ON/OFF timing relationship between one or more differential switches having two transistors, the one or more differential switches being connected at a tail node to a common current generator, the ON/OFF timing relationship controlled by ON/OFF signals that control the state of the transistors such that one transistor turns ON while the other is turning OFF, the method comprising:
deriving an overlap signal from the tail node, wherein the overlap signal is indicative of whether ON/OFF signals are overlapping too much or too little;
generating a control signal based on the overlap signal; and
adjusting the timing of driver signals used to derive the ON/OFF signals based on the control signal such that when said control signal indicates, more overlap of the ON/OFF signals is needed, said clock adjusts the timing of the driver signals to cause more overlap of the derived ON/OFF signals; and when said control signal indicates less overlap of the ON/OFF signals is needed, said clock generator adjusts the timing of the driver signals such that there is less overlap of the derived ON/OFF signals.

15. The method, as per claim 14, wherein the overlap signal is derived based on a comparison of the tail node to a DC reference node.

16. The method, as per claim 14, wherein the overlap signal is derived based on the peak-to-peak value of the tail node.

17. The method, as per claim 14, wherein the method is used in a differential current steering digital-to-analog converter.

18. A control loop to control the ON/OFF timing relationship one or more differential switches having two transistors, the one or more differential switches being connected at a tail node to a common current generator, the ON/OFF timing relationship of the transistors controlled by ON/OFF signals that control the state of the transistors such that one transistor turns ON while the other is turning OFF, the control loop comprising:
a controller to receive an overlap signal, the overlap signal being derived from the tail node and indicative of whether the ON/OFF signals are overlapping too much or too little, and to generate a control signal based upon the received overlap signal; and
at least one switch driver, in response to said control signal, to adjust the voltage levels of the ON/OFF signals such that when said control signal indicates, more overlap of the ON/OFF signals is needed, said switch driver adjusts the voltage levels of the ON/OFF signals to cause more overlap of the transistors' ON/OFF timing; and when said control signal indicates less overlap of the ON/OFF signals is needed, said switch driver adjusts the voltage levels of the ON/OFF signals to cause less overlap of the transistors' ON/OFF timing.

19. The control loop, as per claim 18, wherein the overlap signal is derived based on a comparison of the tail node to a DC reference node.

20. The control loop, as per claim 19, wherein the comparison is performed using a comparator having a first input connected to the tail node and a second input connected to the DC reference node, wherein an output of the comparator outputs the overlap signal.

21. The control loop, as per claim 20, wherein hysterisis is used with the comparator.

22. The control loop, as per claim 18, wherein the overlap signal is derived based on the peak-to-peak value of the tail node.

23. The control loop, as per claim 22, wherein the peak-to-peak value is measured by a peak detector.

24. The control loop, as per claim 23, wherein the peak-to-peak value measured by the peak detector is converted to a digital value by an analog-to-digital converter and provided to the controller as the overlap signal.

25. The control loop, as per claim 18, wherein the control loop is used in a differential current steering digital-to-analog converter.

26. A method of controlling the ON/OFF timing relationship between one or more differential switches having two transistors, the one or more differential switches being connected at a tail node to a common current generator, the ON/OFF timing relationship controlled by ON/OFF signals that control the state of the transistors such that one transistor turns ON while the other is turning OFF, the method comprising:
deriving an overlap signal from the tail node excursion, wherein the overlap signal is indicative of whether ON/OFF timing is overlapping too much or too little;
generating a control signal based on the overlap signal; and
adjusting the voltage of the ON/OFF signals based on the control signal such that when the control signal indicates, more overlap of the ON/OFF signals is needed, the voltage of the ON/OFF signals is adjusted such that there is more overlap of the transistors' ON/OFF timing; and when the control signal indicates less overlap of the ON/OFF signals is needed, the voltage of the ON/OFF signals is adjusted such that there is less overlap of the transistors' ON/OFF timing.

27. The method, as per claim 26, wherein the overlap signal is derived based on a comparison of the tail node to a DC reference node.

28. The method, as per claim 26, wherein the overlap signal is derived based on the peak-to-peak value of the tail node.

29. The method, as per claim 26, wherein the method is used in a differential current steering digital-to-analog converter.

* * * * *